(12) United States Patent
Aiba

(10) Patent No.: US 11,912,029 B2
(45) Date of Patent: Feb. 27, 2024

(54) LIQUID DISCHARGING HEAD AND PRINTING APPARATUS

(71) Applicant: BROTHER KOGYO KABUSHIKI KAISHA, Nagoya (JP)

(72) Inventor: Takashi Aiba, Nagoya (JP)

(73) Assignee: BROTHER KOGYO KABUSHIKI KAISHA, Nagoya (JP)

(*) Notice: Subject to any disclaimer, the term of this patent is extended or adjusted under 35 U.S.C. 154(b) by 26 days.

(21) Appl. No.: 17/728,511

(22) Filed: Apr. 25, 2022

(65) Prior Publication Data

US 2022/0339936 A1   Oct. 27, 2022

(30) Foreign Application Priority Data

Apr. 27, 2021   (JP) ................. 2021-075312

(51) Int. Cl.
*B41J 2/14* (2006.01)
*H10N 30/50* (2023.01)
*H10N 30/20* (2023.01)

(52) U.S. Cl.
CPC ...... *B41J 2/14201* (2013.01); *H10N 30/2047* (2023.02); *H10N 30/50* (2023.02)

(58) Field of Classification Search
None
See application file for complete search history.

(56) References Cited

U.S. PATENT DOCUMENTS

| 2009/0073227 A1* | 3/2009 | Sakaida .............. B41J 2/1433 347/42 |
| 2010/0128089 A1 | 5/2010 | Sugahara |
| 2011/0074885 A1* | 3/2011 | Usui .................. B41J 2/14233 347/50 |
| 2016/0167365 A1 | 6/2016 | Hirabayashi |

FOREIGN PATENT DOCUMENTS

| JP | 2010-125597 A | 6/2010 |
| JP | 2015-47833 A | 3/2015 |
| JP | 2016-137641 A | 8/2016 |

* cited by examiner

*Primary Examiner* — Erica S Lin
(74) *Attorney, Agent, or Firm* — Merchant & Gould P.C.

(57) ABSTRACT

There is provided liquid discharging head having unit heads. Each of the unit heads includes: first piezoelectric layer, driving electrodes arranged on surface of the first piezoelectric layer and to each of which one of first and second potentials is to be applied, and common electrode. The common electrode includes: potential receiving part configured to receive one of the first and second potentials; and extending part extending in extending direction orthogonal to the first direction, so as to overlap with the driving electrodes in the first direction. The unit heads are arranged so that the common electrodes of the plurality of unit heads are adjacent to each other in second direction orthogonal to the first direction. The extending directions of two of the common electrodes adjacent to each other in the second direction are opposite to each other.

11 Claims, 13 Drawing Sheets

FIG. 1
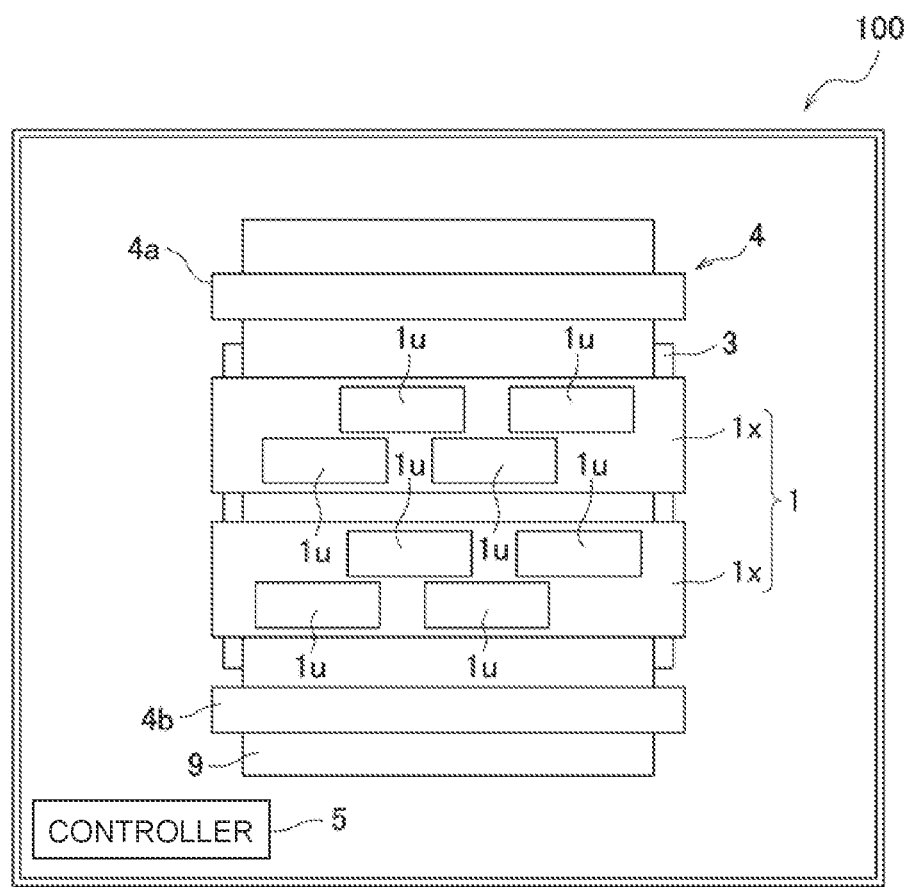
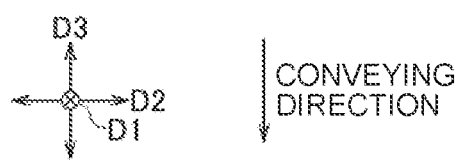
CONVEYING DIRECTION

FIG. 5
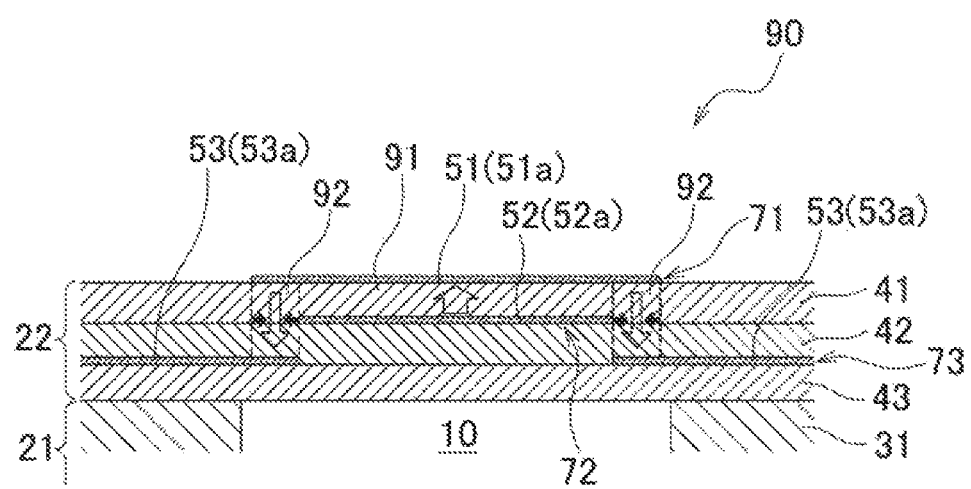
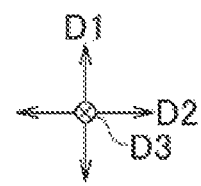

FIG. 7
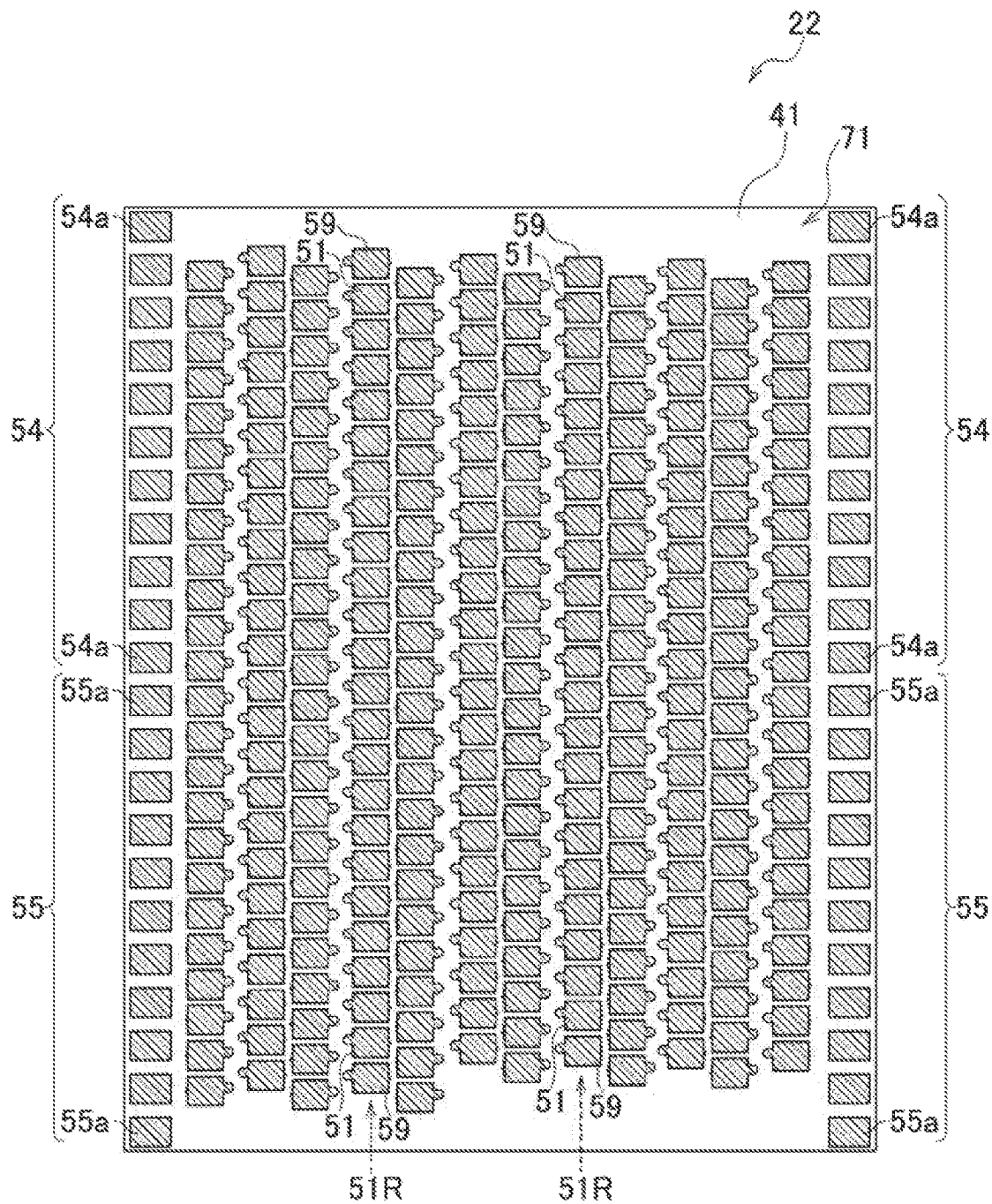
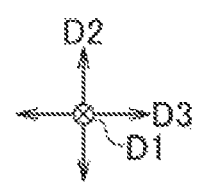

LIQUID DISCHARGING HEAD AND PRINTING APPARATUS

CROSS REFERENCE TO RELATED APPLICATION

The present application claims priority from Japanese Patent Application No. 2021-075312, filed on Apr. 27, 2021, the disclosure of which is incorporated herein by reference in its entirety.

BACKGROUND

The present disclosure relates to a liquid discharging head provided with a plurality of unit heads each of which includes a common electrode having an extending part.

There is a known head which has a piezoelectric layer and a conductive pattern arranged on a surface of the piezoelectric layer. The conductive pattern includes a plurality of individual electrodes (driving electrodes) and two conducting patterns (common electrodes) having a comb-like shape. Each of the two conductive patterns having the comb-like shape has a part (potential receiving part) connected to a power source via a through hole of the piezoelectric layer, and a part (extending part) extending from a connection part with the foregoing part (potential receiving part) toward the downstream side in a conveying direction (extending direction) so as to overlap with the plurality of individual electrodes (driving electrodes) in a thickness direction of the piezoelectric layer (first direction). This head has a plurality of actuator parts which are formed therein and each of which corresponds to one of the plurality of individual electrodes (driving electrodes).

SUMMARY

According to an aspect of the present disclosure, there is provided a liquid discharging head having a plurality of unit heads.

Each of the plurality of unit heads includes a first piezoelectric layer, a plurality of driving electrodes, and a common electrode.

The plurality of driving electrodes is arranged on a surface of the first piezoelectric layer and to each of which either one of a first potential and a second potential different from the first potential is to be selectively applied.

The common electrode is arranged on an opposite side to the plurality of driving electrodes with respect to the first piezoelectric layer, in the first direction being a thickness direction of the first piezoelectric layer.

The common electrode includes a potential receiving part and an extending part.

The potential receiving part is configured to receive either one of the first potential and the second potential.

An extending part extends, from a connection part between the potential receiving part and the extending part, in an extending direction orthogonal to the first direction, so as to overlap with the plurality of driving electrodes in the first direction.

The plurality of unit heads is arranged so that the common electrodes of the plurality of unit heads are adjacent to each other in a second direction orthogonal to the first direction.

The extending directions of two of the common electrodes adjacent to each other in the second direction are opposite to each other.

BRIEF DESCRIPTION OF THE DRAWINGS

FIG. 1 is a plane view of a printer 100 including a head 1.

FIG. 5 is a cross-sectional view along a V-V line in FIG. 3.

FIG. 7 is a plane view depicting an upper surface of a piezoelectric layer 41 which is an uppermost layer among three piezoelectric layers 41 to 43 constructing a piezoelectric actuator 22 of FIG. 2.

DETAILED DESCRIPTION

Figure 2:
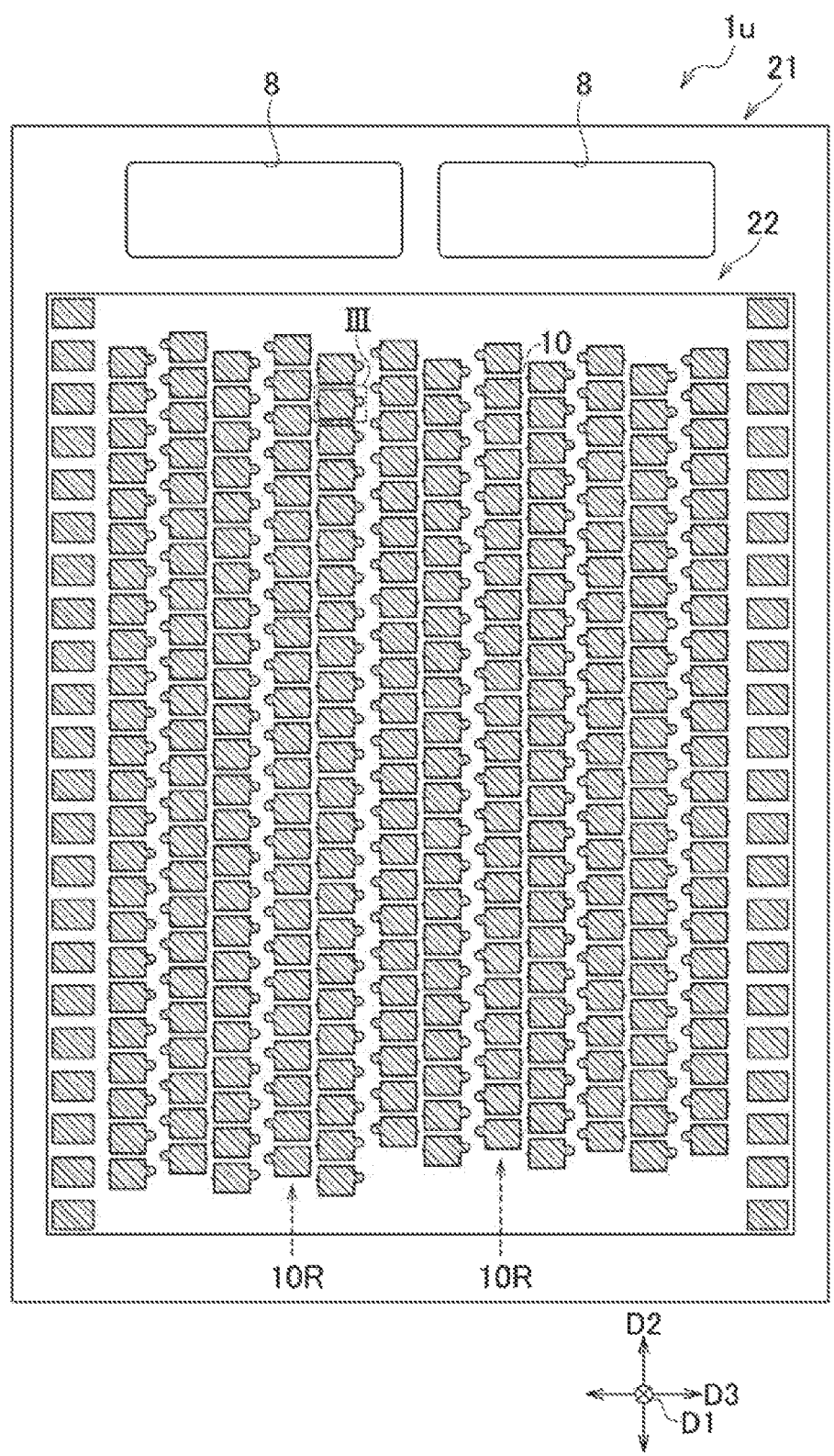
FIG. 2 is a plane view depicting a unit head 1*u* constructing the head 1 of FIG. 1.

It is considered to form one liquid discharging head by using a plurality of pieces of a head (unit head) of Japanese Patent Application Laid-open No. 2016-137641. In the above-described configuration of the electrodes, however, the electrical resistance in the extending part of the common electrode becomes greater further at the downstream side in the extending direction of the extending part of the common electrode. In particular, as a discharge duty is higher and the charge quantity is greater, the difference in the electrical resistance becomes greater between the upstream and downstream sides in the extending direction of the extending part. A rising timing of a pulse is delayed further on the downstream side in the extending direction of the extending part (consequently, a discharging timing from a nozzle corresponding to this part, of the extending part, on the downstream side is delayed); further, a deformation amount of an actuator part corresponding to this part, of the extending part, on the downstream side becomes small (consequently, a volume of a liquid droplet discharged from the corresponding nozzle becomes small). Accordingly, in a case that the plurality of unit heads are arranged in arrangement direction (second direction), and that the extending direction of one common electrode and the extending direction of the other common electrode of two common electrodes which are adjacent to each other in the second directions are mutually same, there arises such a situation that a part at which the electrical resistance is great (a part corresponding to a downstream end of the extending part) and another part at which the electrical resistance is small (a part corresponding to an upstream end of the extending part) are present in a boundary part between the two common electrodes, which consequently leads to such a situation that the difference in volume of the liquid droplets in the boundary part appears as any unevenness in density.

An object of the present disclosure is to provide a liquid discharging head and a printing apparatus capable of suppressing any unevenness in density in the case of arranging a plurality of unit heads each of which includes a common electrode having an extending part.

First Embodiment

First, the overall configuration of a printer 100 including a head (liquid discharging head) 1 according to a first embodiment of the present disclosure will be explained, with reference to FIG. 1.

Note that in the following explanation, first direction D1 is a vertical direction, second direction D2 and third direction D3 are each horizontal direction. The second direction D2 and the third direction D3 are both orthogonal to the first direction D1. The second direction D2 is orthogonal to the third direction D3. In this document, each of the first direction D1, the second direction D2, and the third direction D3 is bidirectional.

The printer 100 is provided with the head 1, a platen 3, a conveying mechanism (conveyer) 4 and a controller 5.

The head 1 has two head units 1x arranged side by side in the third direction D3. Each of the head units 1x is long in the second direction D2, and has four unit heads 1u which are arranged in the second direction D2 in a staggered (zigzag) manner. Each of the two head units 1x is of a line system in which an ink is discharged or ejected from nozzles 15 (see FIGS. 3 and 4) toward a sheet 9 in a state that the position of each of the two head units 1x is fixed. Inks discharged from the respective unit heads 1u are of a mutually same color (for example, a black ink).

The platen 3 is a member having a flat plate-like shape arranged at a location below the head 1 the sheet 9 is arranged on the upper surface of the platen 3.

The conveying mechanism 4 has two roller pairs 4a and 4b which are arranged while interposing the platen 3 therebetween in the third direction D3. In a case that a conveying motor (not depicted in the drawings) is driven by a control of the controller 5, the roller pairs 4a and 4b rotate in a state that each of the roller pairs 4a and 4b holds or pinches the sheet 9, and the sheet 9 is conveyed in a conveying direction along the third direction D3.

The controller 5 has a ROM (Read Only Memory), a RAM (Random Access Memory), and an ASIC (Application Specific Integrated Circuit). The ASIC executes a recording processing, etc., in accordance with a program stored in the ROM. In the recording processing, the controller 5 controls the conveying motor and a driver IC (both of which are not illustrated in the drawings), based on a recording instruction (including image data) inputted from an external apparatus such as a PC, etc., to thereby cause conveyance of the sheet 9 by the conveying mechanism 4 and discharge of an ink to the sheet 9 by the head 1 to be executed, and to record an image on the sheet 9.

Next, the configuration of the unit head 1u will be explained.

As depicted in FIG. 2, the unit head 1u has a channel member 21 and a piezoelectric actuator 22. The channel member 21 and the piezoelectric actuator 22 each have a rectangular shape in which a length thereof in the second direction D2 is longer than a length thereof in the third direction D3 in a plane orthogonal to the first direction D1.

Figure 4:
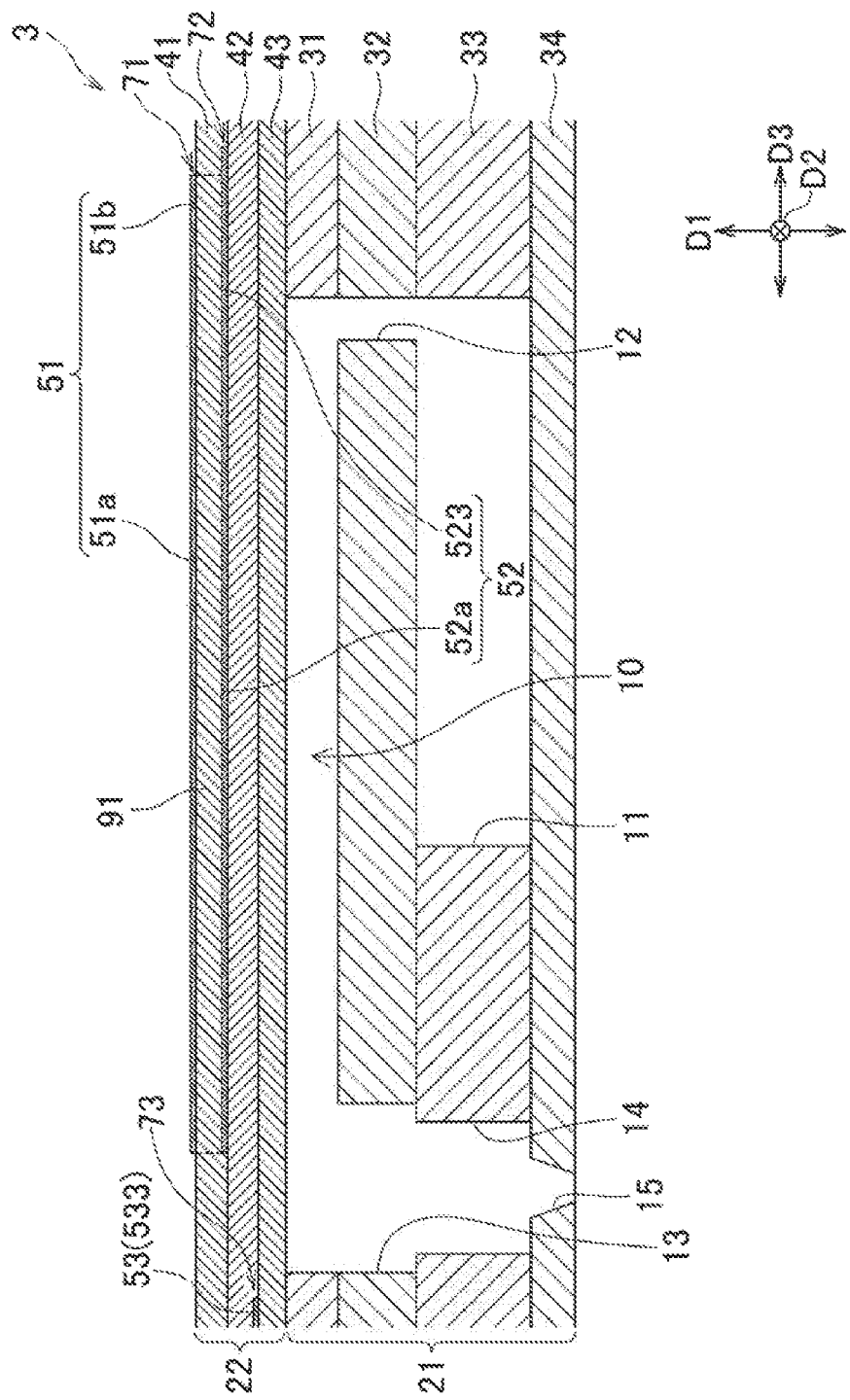
FIG. 4 is a cross-sectional view along a IV-IV line in FIG. 3.

As depicted in FIG. 4, the channel member 21 is constructed of four metallic plates 31 to 34 which are stacked in the first direction D1.

The plate 31 has a plurality of pressure chambers 10 formed therein. The plate 32 has communicating channels 12 each of which is formed with respect to one of the plurality of pressure chambers 10 and communicating channels 13 each of which is formed with respect to one of the plurality of pressure chambers 10. Each of the communicating channels 12 and each of the communicating channels 13 overlap in the first direction D1, respectively, with one end and the other end in the third direction D3 of one of the plurality of pressure chambers 10 corresponding thereto. The plate 33 has communicating channels 14 each of which is formed with respect to one of the communicating channels 13. Each of the communicating channels 14 overlaps, in the first direction D1, with one of the communicating channels 13 corresponding thereto. The plate 33 further has twelve manifold channels 11 which are formed therein. Each of the twelve manifold channels 11 is provided with respect to one of pressure chamber rows 10R (see FIG. 2) each constructed of pressure chambers 10 aligned in the second direction D2. Each of the manifold channels 11 extends in the second direction D2, and communicates with the pressure chambers 10 belonging to one of the pressure chamber rows 10R corresponding thereto, respectively, via the communicating channels 12. The plate 34 has the plurality of nozzles 15 formed therein. Each of the plurality of nozzles 15 overlaps with one of the communicating channels 14 in the first direction D1.

Two ink supply ports (openings) 8 are formed in the upper surface, of the plate 31, at an area thereof in which the piezoelectric actuator 22 is not arranged (see FIG. 2). Each of the two ink supply ports 8 communicates with an ink cartridge (not depicted in the drawings) via a tube, and communicates with six manifold channels 11. The ink supplied from the ink cartridge to each of the two ink supply ports 8 via the tube is supplied to the six manifold channels 11. From each of the six manifold channels 11, the ink is supplied, via the communicating channels 12, respectively, to the pressure chambers 10 belonging to one of the pressure chamber rows 10R. Further, in a case that the piezoelectric actuator 22 is driven as will be described later on, pressure is imparted to the ink inside each of the pressure chambers 10, and the ink flows through the communicating channels 13 and 14 and is discharged from the nozzle 15.

As depicted in FIG. 4, the piezoelectric actuator 22 is arranged on the upper surface of the channel member 21. The piezoelectric actuator 22 has three piezoelectric layers 41 to 43, a plurality of driving electrodes 51, a high potential (electric potential) electrode (common electrode, first potential electrode) 52 and a low potential (electric potential) electrode (common electrode, second potential electrode) 53.

Each of the three piezoelectric layers 41 to 43 is made of a piezoelectric material which includes lead zirconate titanate, etc., as a main component, and the three piezoelectric layers 41 to 43 are stacked in the first direction D1. The piezoelectric layer 42 is stacked with respect to the piezoelectric layer 41 in the first direction D1. The piezoelectric layer 43 is stacked with respect to the piezoelectric layer 41 and the piezoelectric layer 42 in the first direction D1, and the piezoelectric layer 42 is interposed between the piezoelectric layer 43 and the piezoelectric layer 41. The piezoelectric layer 41 is an example of a "first piezoelectric layer" of the present invention, the piezoelectric layer 42 is an example of a "second piezoelectric layer" of the present invention, and the piezoelectric layer 43 is an example of a "third piezoelectric layer" of the present invention.

The piezoelectric layer 43 is arranged on the upper surface of the plate 31, and covers all of the plurality of pressure chambers 10 formed in the plate 31.

Figure 3:
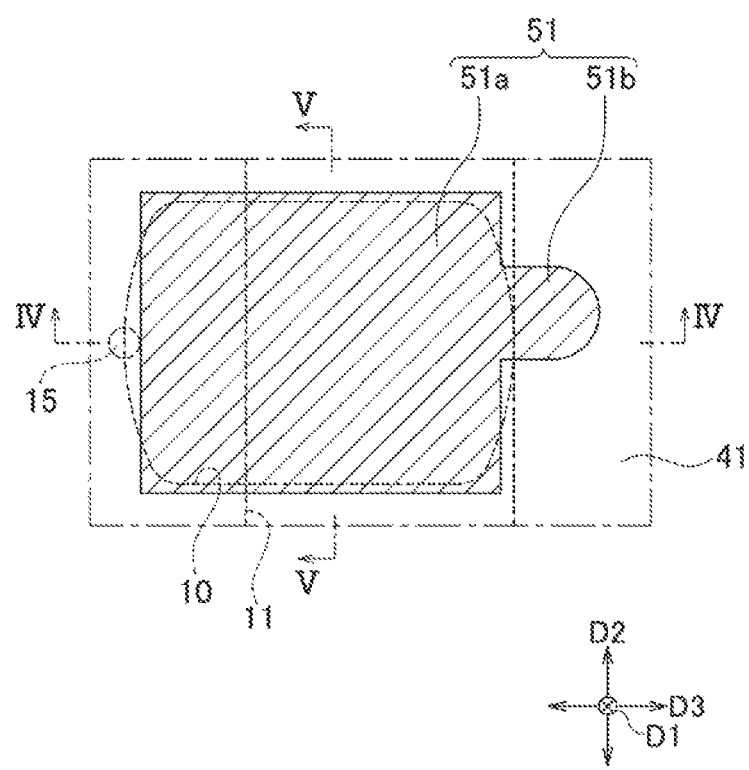
FIG. 3 is an enlarged view of an area III in FIG. 2.

As depicted in FIG. 3, each of the plurality of driving electrodes 51 are arranged on the upper surface of the piezoelectric layer 41, corresponding to one of the plurality of pressure chambers 10. Each of the plurality of driving electrodes 51 has a main part 51a and a protruded part 51b. The main part 51a overlaps, in the first direction D1, with a substantially entire area of each of the plurality of pressure chambers 10 corresponding thereto. The protruded part 51b protrudes from the main part 51a in the third direction D3, and does not overlap, in the first direction D1, with each of the plurality of pressure chambers 10 corresponding thereto. The protruded part 51b is provided with a contact point which is (to be) electrically connected to a COF (Chip On Film; not depicted in the drawings). A driver IC (not depicted in the drawings) mounted on the COF is controlled by the controller 5 so as to selectively impart either one of a high potential (high electric potential, VDD potential) and a low potential (low electric potential, GND potential) with respect to each of the plurality of driving electrodes 51 via a wiring of the COF.

As depicted in FIG. 7, the plurality of driving electrodes 51 are aligned in the second direction D2, and form a plurality of driving electrode rows 51R each of which corresponds to one of the pressure chamber rows 10R (see FIG. 2). The plurality of driving electrode rows 51R are arranged side by side in the third direction D3.

With respect to each of the plurality of driving electrode rows 51R, dummy electrodes 59 are provided, respectively, on one side in the second direction D2 (the upper side in FIG. 7) and on the other side in the second direction D2 (the lower side in FIG. 7). Each of the dummy electrodes 59 has a size and a shape, in a plane orthogonal to the first direction D1, which are same as those of the driving electrodes 51 belonging to one of the driving electrode rows 51R corresponding thereto, and the dummy electrodes 59 are arranged, together with the driving electrodes 59, in the second direction D2, with an equal spacing distance therebetween. The dummy electrodes 59 are not electrically connected to the COF, and the potential is not applied to the dummy electrodes 59. By providing the dummy electrodes 59, it is possible to suppress any difference in a contracting amount due to the formation of the electrodes between a driving electrode 51 which is located at the center in the second direction D2 of each of the driving electrode rows 51R and driving electrodes 51 which are located in the end parts in the second direction D2 of each of the driving electrode rows 51R, consequently thereby making it possible to suppress any variation or fluctuation in a discharge amount among the nozzles 15 corresponding to each of the driving electrode rows 51R.

Two high potential-connecting electrode parts 54 and two low potential-connecting electrode parts 55 are provided, in addition to the driving electrodes 51 and the dummy electrodes 59, on the upper surface of the piezoelectric layer 41.

The two high potential-connecting electrode parts 54 are provided, respectively, on one end in the third direction D3 (left end in FIG. 7) and the other end in the third direction D3 (right end in FIG. 7) of the piezoelectric layer 41, at one end in the second direction D2 of the piezoelectric layer 41 (upper side in FIG. 7). The two low potential-connecting electrode parts 55 are provided, respectively, on the one end in the third direction D3 (left end in FIG. 7) and the other end in the third direction D3 (right end in FIG. 7) of the piezoelectric layer 41, at the other end in the second direction D2 of the piezoelectric layer 41 (lower side in FIG. 7).

Each of the two high potential-connecting electrode parts 54 is constructed of a plurality of connecting electrodes 54a which are arranged to be separated from each other in the second direction D2; and each of the two low potential-connecting electrodes parts 55 is constructed of a plurality of connecting electrodes 55a which are arranged to be separated from each other in the second direction D2. The plurality of connecting electrodes 54a and the plurality of connecting electrodes 55a have a size and a shape in the plane orthogonal to the first direction D1 which are substantially same as one another. By the control of the controller 5, the driver IC applies the high potential (VDD potential) to the plurality of connecting electrodes 54a, via the wiring of the COF, and applies the low potential (GND potential) to the plurality of connecting electrodes 55a, via the wiring of the COF. The plurality of connecting electrodes 54a are maintained at the high potential, and the plurality of connecting electrodes 55a are maintained at the low potential.

Figure 8:
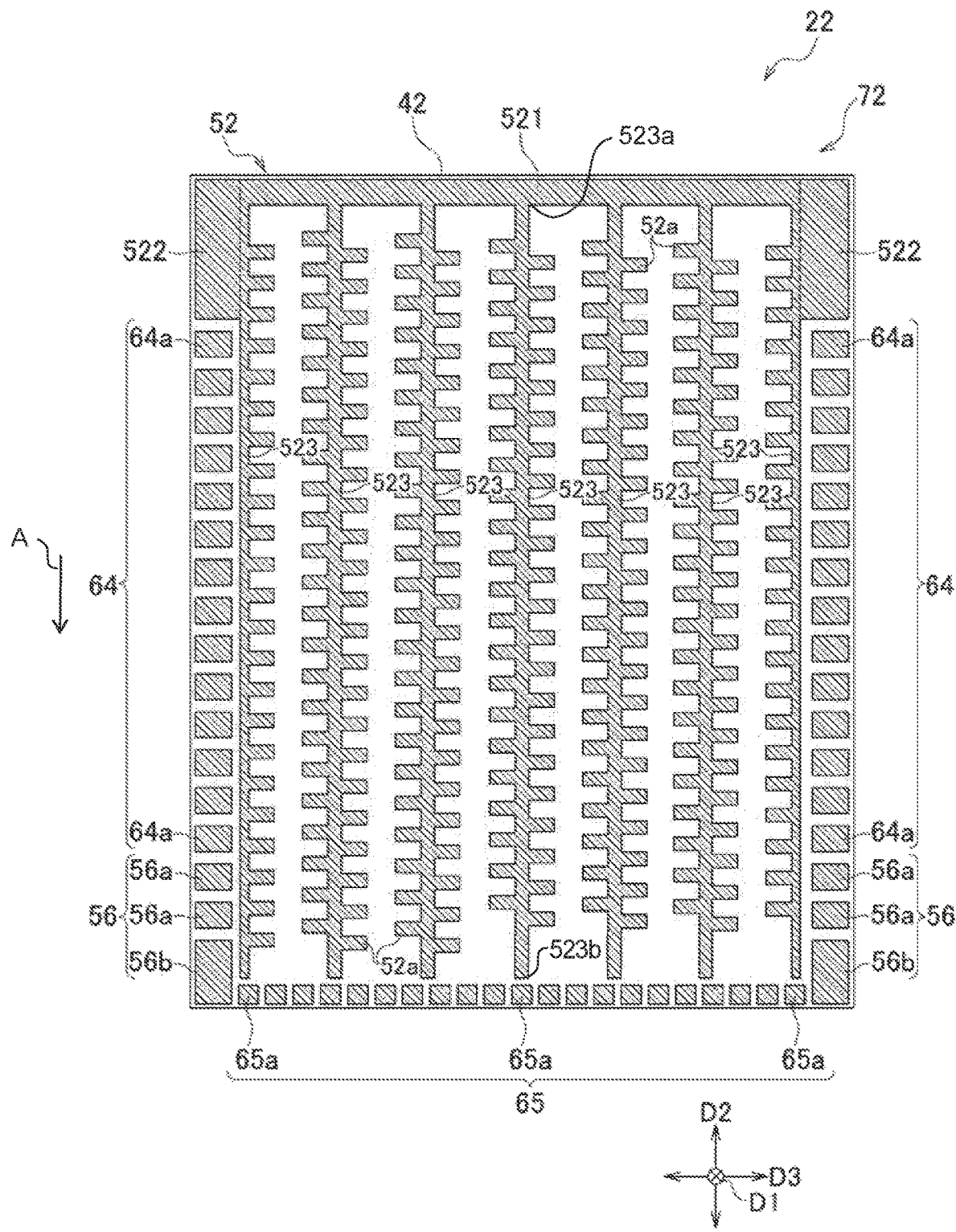
FIG. 8 is a plane view depicting an upper surface of a piezoelectric layer 42 which is an intermediate layer among the three piezoelectric layers 41 to 43 constructing a piezoelectric actuator 22 of FIG. 2.

The high potential electrode 52 is arranged on the upper surface of the piezoelectric layer 42, as depicted in FIG. 8, and includes a trunk part 521, a plurality of extending parts 523 branched from the trunk part 521, a plurality of individual parts 52a branched from each of the plurality of extending parts 523, and two high potential receiving parts (potential receiving parts) 522.

The trunk part 521 extends in the third direction D3 at the one end in the second direction D2 (upper end in FIG. 8) of the piezoelectric layer 42. The plurality of extending parts 523 are arranged in the third direction D3, and each of the plurality of extending parts 523 extends from the trunk part 521 toward the other side in the second direction D2 (lower side in FIG. 8). A base end 523a of each of the plurality of extending parts 523 is connected to the trunk part 521, and a forward end 523b of each of the plurality of extending parts 523 is a terminal end part which is not connected to another conductive part. Trunk part 521 is a linear part. The plurality of extending parts 523 is the plurality of linear parts extending parallel to each other. Each of the plurality of individual parts 52a has a part which overlaps, in the first direction D1, with a central part in the second direction D2 of one of the pressure chambers 10, and overlaps with one of the driving electrodes 51 in the first direction D1 (see FIG. 5). In the invention, "the extending part" may include the extending part 523 and the individual parts 52a.

One of the two high potential receiving parts 522 is connected to one end in the third direction D3 (left end in FIG. 8) of the trunk part 521. The other of the two high potential receiving parts 522 is connected to the other end in the third direction D3 (right end in FIG. 8) of the trunk part 521. The two high potential receiving parts 522 extend in the second direction D2, respectively, at one end in the third direction D3 (left end in FIG. 8) and the other end in the third direction (right end in FIG. 8) of the piezoelectric layer 42.

Each of the two high potential receiving parts 522 overlaps, in the first direction D1, with several pieces among the plurality of connecting electrodes 54a constructing the high potential-connecting electrode part 54. Each of the two high potential receiving parts 522 is electrically connected to the several pieces among the plurality of connecting electrodes 54a via through holes formed in the piezoelectric layer 41 and receives the high potential from the several pieces among the plurality of connecting electrodes 54a.

Two low potential-connecting electrode parts 56, two float electrode parts 64 and a float electrode part 65 are provided, in addition to the high potential electrode 52, on the upper surface of the piezoelectric layer 42.

The two low potential-connecting electrode parts 56 are arranged, respectively, on one end in the third direction D3 (left end in FIG. 8) and the other end in the third direction D3 (right end in FIG. 8) of the piezoelectric layer 42, on the other side in the second direction D2 (lower side in FIG. 8) in the piezoelectric layer 42. Each of the two low potential-connecting electrode parts 56 is constructed of two connecting electrodes 56a and one connecting electrode 56b which are arranged, while being separated from each other, in the second direction D2.

The two float electrode parts 64 are arranged, respectively, one end (left end in FIG. 8) in the third direction D3 and the other end (the right end in FIG. 8) in the third direction D3 of the piezoelectric layer 42, each between the high potential receiving part 522 and the low potential-connecting potential parts 56. Each of the two float electrode parts 64 is constructed of a plurality of float electrodes 64a which are arranged in the second direction D2 while being separated from each other.

The float electrode part 65 is arranged on the other end in the second direction D2 of the piezoelectric layer 42 (lower end in FIG. 8). The float electrode pail 65 is constructed of a plurality of float electrodes 65a which are arranged in the third direction D3 while being separated from each other. The plurality of float electrodes 65a have a size and a shape in the plane orthogonal to the first direction D1 which are substantially same as one another, and are arranged in the third direction D3 with an equal spacing distance therebetween.

The two connecting electrodes 56a of each of the two low potential-connecting electrode parts 56 and the plurality of float electrodes 64a of each of the two float electrode parts 64 have a size and a shape in the plane orthogonal to the first direction D1 which are substantially same as one another, and are arranged, respectively, at one end in the third direction D3 (left end in FIG. 8) and the other end in the third direction D3 (right end in FIG. 8) of the piezoelectric layer 42, with an equal spacing distance therebetween. On the other hand, the connecting electrode 56b of each of the two low potential-connecting electrode parts 56 have a length in the second direction D2 which are longer than a length in the second direction D2 of the connecting electrodes 56a.

The connecting electrodes 56a and 56b overlap, in the first direction D1, with several pieces among the plurality of connecting electrodes 55a constructing the low potential-connecting electrode part 55. The connecting electrodes 56a and 56b are electrically connected to the several pieces among the plurality of connecting electrodes 55a via through holes formed in the piezoelectric layer 41.

Each of the floating electrodes 64a and 65a of the floating electrode parts 64 and 65 is not electrically connected to any one of the electrodes, and any potential is not applied thereto.

Figure 9:
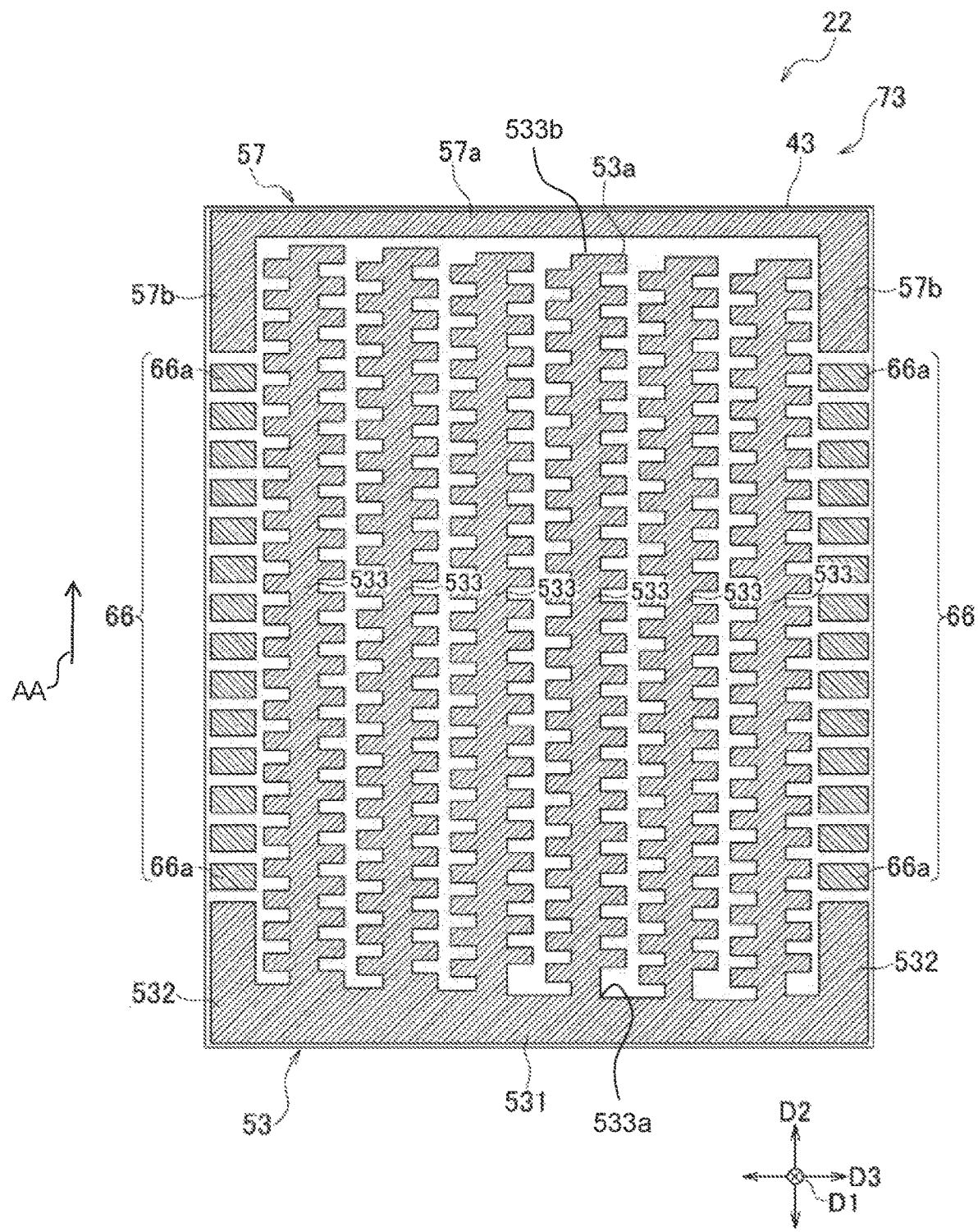
FIG. 9 is a plane view depicting an upper surface of a piezoelectric layer 43 which is a lowermost layer among the three piezoelectric layers 41 to 43 constructing a piezoelectric actuator 22 of FIG. 2.

As depicted in FIG. 9, the low potential electrode 53 is arranged on the upper surface of the piezoelectric layer 43, and includes a trunk part 531, a plurality of extending parts 533 branched from the trunk part 531, a plurality of individual parts 53a branched from each of the plurality of extending parts 533, and two low potential receiving parts (potential receiving parts) 532.

The trunk part 531 extends in the third direction D3 at the other end in the second direction D2 (lower end in FIG. 9) of the piezoelectric layer 43. The plurality of extending parts 533 are arranged side by side in the third direction D3, and each of the plurality of extending parts 533 extends from the trunk part 531 toward the one side in the second direction D2 (upper side in FIG. 9). A base end 533a of each of the plurality of extending parts 533 is connected to the trunk part 531, and a forward end 533b of each of the plurality of extending parts 533 is a terminal end which is not connected to another conductive part. The trunk part 531 is a linear part. The plurality of extending parts 533 is the plurality of linear parts extending parallel to each other. Each of individual parts 53a, which are included in the plurality of individual parts 53a and which are different from individual parts 53a located, respectively, at the one end and the other end in the second direction D2, spreads over two pressure chambers 10, among the pressure chambers 10, adjacent to each other in the second direction D2, and has parts overlapping, in the first direction D1, with the two pressure chambers 10 (see FIG. 5). Each of the individual parts 53a located, respectively, at the one end and the other end in the second direction D2 has a part overlapping, in the first direction D1, with one pressure chamber 10 among the plurality of pressure chambers 10. Further, each of the plurality of individual parts 53a has a part overlapping with each of the plurality of driving electrodes 51 in the first direction D1. In the invention, "the extending part" may include the extending part 533 and the individual parts 53a.

One of the two low potential receiving parts 532 is connected to one end in the third direction D3 (left end in FIG. 9) of the trunk part 531. The other of the two low potential receiving parts 532 is connected to the other end in the third direction D3 (right end in FIG. 9) of the trunk part 531. The two low potential receiving parts 532 extend in the second direction D2, respectively, at one end in the third direction D3 (left end in FIG. 9) and the other end in the third direction (right end in FIG. 9) of the piezoelectric layer 43.

Each of the two low potential receiving parts 532 overlaps, in the first direction D1, with several pieces among the plurality of connecting electrodes 55a (see FIG. 7) constructing the low potential-connecting electrode part 55, and overlaps, in the first direction D1, with several pieces among the connecting electrodes 56a, 56b (see FIG. 8) constructing the low potential-connecting electrode part 56. Each of the two low potential receiving parts 532 is electrically connected to the several pieces among the connecting electrodes 56a, 56b via through holes formed in the piezoelectric layer 42. Each of the several pieces among the plurality of connecting electrodes 56a, 56b is electrically connected to one of the connecting electrodes 55a of the low potential-connecting electrode part 55, as described above. Accordingly, each of the two low potential receiving parts 532 is electrically connected to the low potential-connecting electrode part 55 (see FIG. 7) via the low potential-connecting electrode part 56 (see FIG. 8), and receives the low potential from the low potential-connecting electrode part 55.

A high potential-connecting electrode part 57 and two floating electrode parts 66 are provided, in addition to the low potential electrode 53, on the upper surface of the piezoelectric layer 43.

The high potential-connecting electrode part 57 has a part 57a extending in the third direction D3 and two parts 57b extending in the second direction D2. The part 57a extends in the third direction D3, at one end in the second direction (upper end in FIG. 9) of the piezoelectric layer 43. One of the two parts 57b is connected to one end in the third direction D3 (left end in FIG. 9) of the part 57a. The other of the two parts 57b is connected to the other end in the third direction D3 (right end in FIG. 9) of the part 57a.

Each of the two parts 57b overlaps, in the first direction D1, with several pieces among the plurality of connecting electrodes 54a constructing the high potential-connecting electrode part 54 (see FIG. 7), and overlaps, in the first direction D1, with one of the two high potential receiving parts 522 constructing the high potential electrode 52 (see FIG. 8). Each of the two parts 57b is electrically connected to one of the two high potential receiving parts 522 via a through hole formed in the piezoelectric layer 42. Each of the two high potential receiving parts 522 is electrically connected to the several pieces among the plurality of connecting electrodes 54a of the high potential-connecting electrode part 54, as described above. Accordingly, each of the two parts 57b is electrically connected to the high potential-connecting electrode part 54 (see FIG. 7) via the high potential receiving part 522 (see FIG. 8), and receives the high potential from the high potential-connecting electrode part 54.

The two float electrode parts 66 are arranged, respectively, one end (left end in FIG. 9) in the third direction D3 and the other end (the right end in FIG. 9) in the third directions D3 of the piezoelectric layer 43, each between the part 57b and the low potential-connecting potential part 532 in the second direction D2. Each of the two float electrode parts 66 is constructed of a plurality of float electrodes 66a which are arranged in the second direction D2 while being separated from each other. The plurality of float electrodes 66a have a size and a shape in the plane orthogonal to the first direction D1 which are substantially same as one another, and are arranged in the second direction D2 with an equal spacing distance therebetween.

Each of the floating electrodes 66a of the two floating electrode parts 66 is not electrically connected to any one of the electrodes, and any potential is not applied thereto.

As depicted in FIG. 5, a part, of the piezoelectric layer 41, which is interposed in the first direction D1 between the driving electrode 51 and the individual part 52a of the high potential electrode 52 is referred to as a first active part 91. A part of the piezoelectric layer 42 and a part of the piezoelectric layer 43 which are interposed in the first direction D1 between the driving electrode 51 and the individual part 53a of the low potential electrode 53 is referred to as a second active part 92. The first active part 91 is polarized mainly upward, and the second active part 92 is polarized mainly downward. The piezoelectric actuator 22 has, with respect to each of the plurality of pressure chambers 10, an actuator part 90 which is constructed of two pieces of the second active part 92 and one piece of the first active part 91 interposed between the two pieces of the second active part 92 in the second direction D2.

Here, an operation of the actuator part 90 corresponding to a certain nozzle 15, in a case that the ink is to be discharged from the certain nozzle 15 will be explained, with reference to FIG. 6.

Figure 6A:
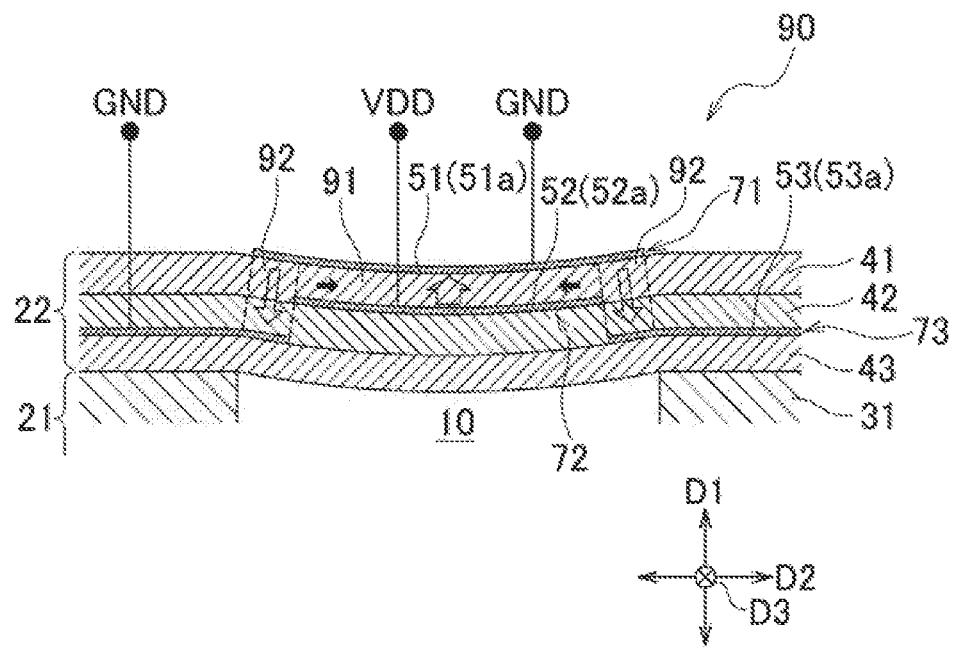
FIGS. 6A and 6B are each a view depicting an operation of an actuator part 90 in a cross section of FIG. 5.
Figure 6B:
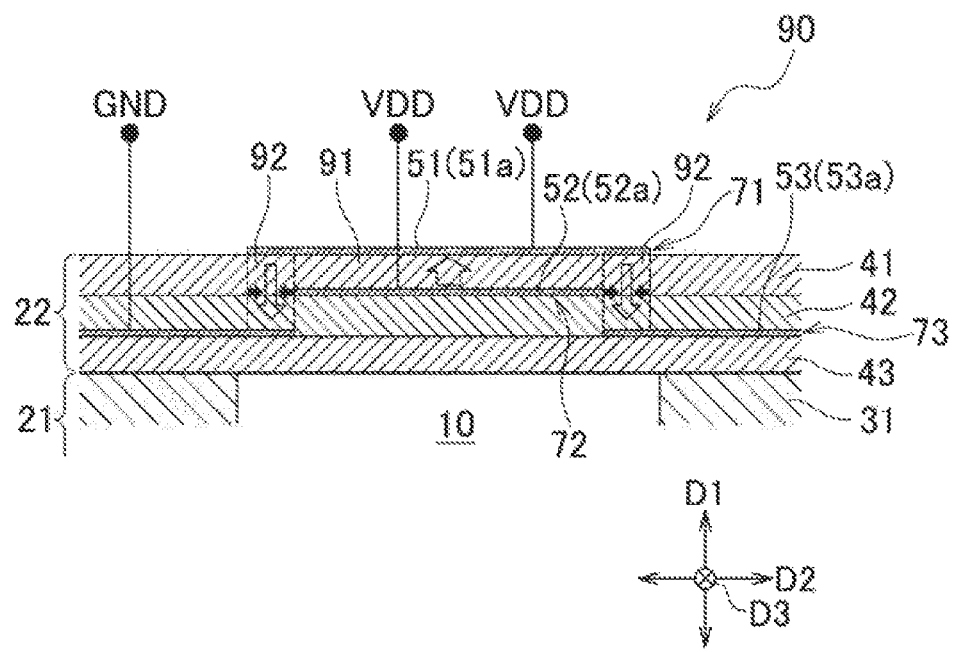

Before the printer 100 starts a printing operation, the low potential (GND potential) is applied to each of the driving electrodes 51, as depicted in FIG. 6A. In this situation, an electric field which is upwardly oriented same as the polarization direction of the first active part 91 is generated in the active part 91, due to the difference in potential between the driving electrode 51 and the high potential electrode 52, thereby causing the first active part 91 to contract in a plane direction (a direction along a surface including the second direction D2 and the third direction D3). With this, a part, in a stacked body constructed of the piezoelectric layers 41 to 43, which overlaps in the first direction D1 with a certain pressure chamber 10 is bent so as to project toward the certain pressure chamber 10 (project downward). In this situation, the volume of the certain pressure chamber 10 becomes to be small, as compared with that in a case that the stacked body is flat.

In a case that the printer 100 starts the recording operation and the ink is to be discharged from the certain nozzle 15, firstly, the potential of a certain driving electrode 51 corresponding to the certain nozzle 15 is switched from the low potential (GND potential) to the high potential (VDD potential). In this situation, the difference in potential between the certain driving electrode 51 and the high potential electrode 52 ceases to exist, thereby cancelling the contraction of the first active part 91. On the other hand, the difference in potential is generated between the certain driving electrode 51 and the low potential electrode 53, thereby generating an electric field which is downwardly oriented same as the polarization direction of the two second active parts 92 and causing the two second active parts 92 to contract in the plane direction. Note that, however, the two second active parts 92 have a function of suppressing any crosstalk (a phenomenon in which a variation in the pressure accompanying with deformation of the actuator part 90 in a certain pressure chamber 10 is transmitted to another pressure chamber 10 adjacent to the certain pressure chamber 10) from occurring, and hardly contribute to the deformation of the actuator part 90. Namely, in this situation, the stacked body is in a flat state, with the part overlapping with the certain pressure chamber 10 in the first direction D1 not being bent in a direction away from the certain pressure chamber 10 (not being bent upward). With this, the volume of the certain pressure chamber 10 becomes great, as compared with the state depicted in FIG. 6A.

Then, as depicted in FIG. 6A, the potential of the certain driving electrode 51 corresponding to the certain nozzle 15 is switched from the high potential (VDD potential) to the low potential (GND potential). In this situation, the difference in potential between the certain driving electrode 51 and the low potential electrode 53 ceases to exist, thereby cancelling the contraction of the two second active parts 92. On the other hand, the difference in potential between the certain driving electrode 51 and the high potential electrode 52 is generated, thereby generating, in the active part 91, the electric field which is upwardly oriented same as the polarization direction of the first active part 91, thereby causing the first active part 91 to contract in the plane direction. With this, the part, of the stacked body, which overlaps in the first direction D1 with the certain pressure chamber 10 is bent so as to project toward the certain pressure chamber 10 (project downward). In this situation, the volume of the certain pressure chamber 10 is reduced greatly, which in turn applies a large pressure to the ink inside the certain pressure chamber 10, thereby discharging or ejecting the ink from the certain nozzle 15.

Here, the plurality of driving electrodes 51, the dummy electrodes 59, the two high potential-connecting electrode parts 54 and the two low potential-connecting electrode parts 55 which are arranged on the upper surface of the piezoelectric layer 41 (a surface, of the piezoelectric layer 41, which is on a side opposite to the piezoelectric layer 42 in the first direction D1) construct a first electrode layer 71 (see FIG. 7). The high potential electrode 52, the two low potential-connecting electrode parts 56, the two float electrode parts 64 and the float electrode part 65 arranged on the upper surface of the piezoelectric layer 42 (between the piezoelectric layer 41 and the piezoelectric layer 42 in the first direction D1) construct a second electrode layer 72 (see FIG. 8). The low potential electrode 53, the high potential-connecting electrode part 57 and the two floating electrode parts 66 provided on the upper surface of the piezoelectric layer 43 (between the piezoelectric layer 42 and the piezoelectric layer 43 in the first direction D1) constructs a third electrode layer 73 (see FIG. 9).

The high potential is an example of a "first potential (first electric potential)" of the present invention, and the high potential electrode 52 is an example of a "first potential electrode (first electric potential electrode)" of the present invention. The low potential is an example of a "second potential (second electric potential)" of the present invention, and the low potential electrode 53 is an example of a "second potential electrode (second electric potential electrode)" of the present invention. Each of the high potential electrode 52 and the low potential electrode 53 is an example of a "common electrode" of the present invention. Each of the high potential receiving part 522 and the low potential receiving part 532 is an example of a "potential receiving part" of the present invention.

Figure 10:
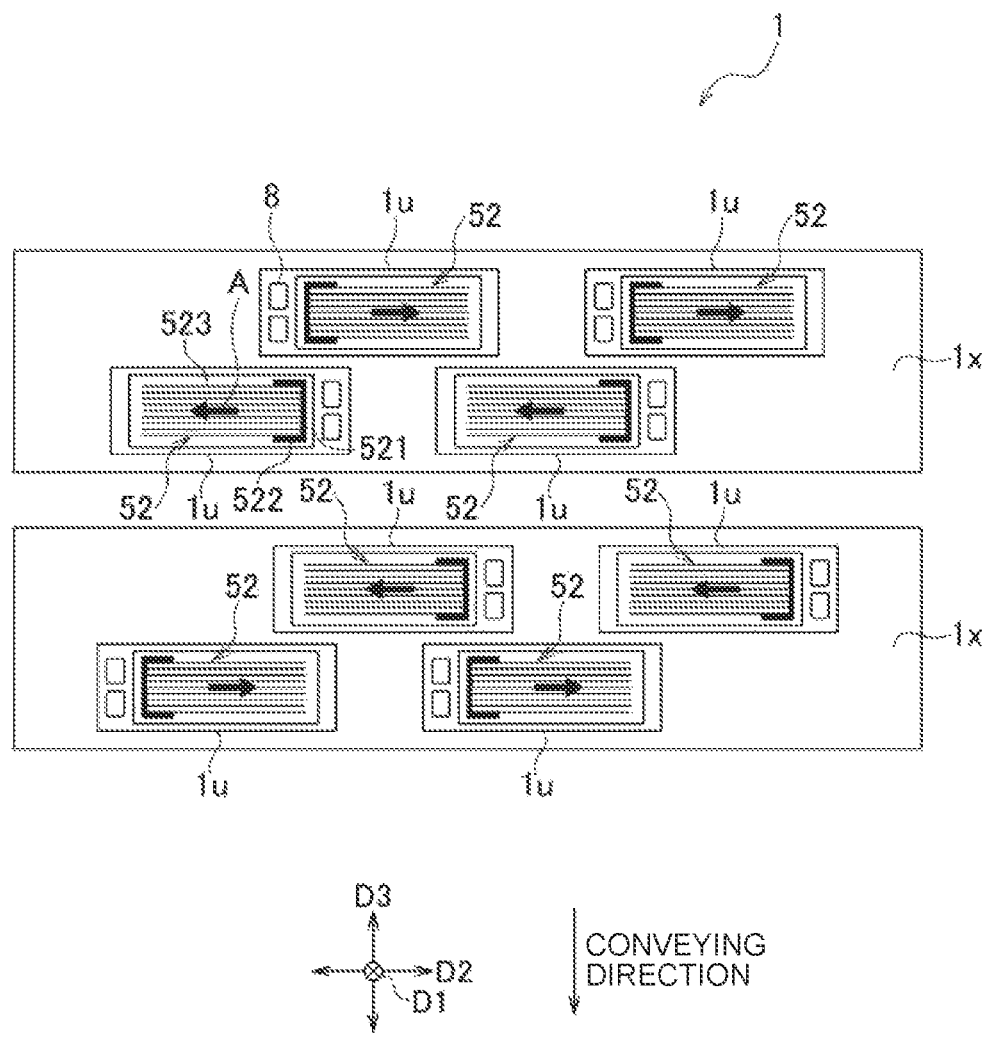
FIG. 10 is a plane view depicting a state that an extending direction A of each of high potential electrodes 52 is arranged alternately in second direction in each of head units 1*x* of the head 1 of FIG. 1.

As depicted in FIG. 10, in each of the two head units 1*x*, the four unit heads 1*u* are arranged so that the high potential electrodes 52 thereof are adjacent to each other in the second direction D2. In each of the four unit heads 1*u*, although an extending direction A (a direction in which the extending part 523 extends from the trunk part 521 (namely, the connection part between the high potential receiving part 522 and the extending part 523), That is, a direction from the base end 523*a* toward the forward end 523*b*) is parallel to the second direction D2, the extending directions A, of two high potential electrodes 52 which are adjacent to each other in the second direction D2, are opposite to each other. In this document, the extending direction A is unidirectional.

Further, in the two head units 1*x*, the extending directions A, of two high potential electrodes 52 which overlap with each other in the third direction D3, are opposite to each other.

In each of the four unit heads 1*u*, the extending direction A of the high potential electrode 52 and an extending direction AA of the low potential electrode 53 are opposite to each other (see FIGS. 8 and 9).

Accordingly, although not depicted in FIG. 10, the above-described points related to the high potential electrode 52 are similarly applied to the low potential electrode 53; the four unit heads 1*u* are arranged so that the low potential electrodes 53 thereof are adjacent to one another in the second direction D2. In each of the four unit heads 1*u*, although the extending direction AA of the low potential electrode 53 (a direction in which the extending part 533 extends from the trunk part 531 (namely, the connection part between the low potential receiving part 532 and the extending part 533). That is, a direction from the base end 533*a* toward the forward end 533*b*) is parallel to the second direction D2, the extending directions AA, of two low potential electrodes 53 which are adjacent to each other in the second direction D2, are opposite to each other. In this document, the extending direction AA is unidirectional.

Further, in the two head units 1*x*, the extending directions AA, of two low potential electrodes 53 which overlap with each other in the third direction D3, are opposite to each other.

Figure 11A:
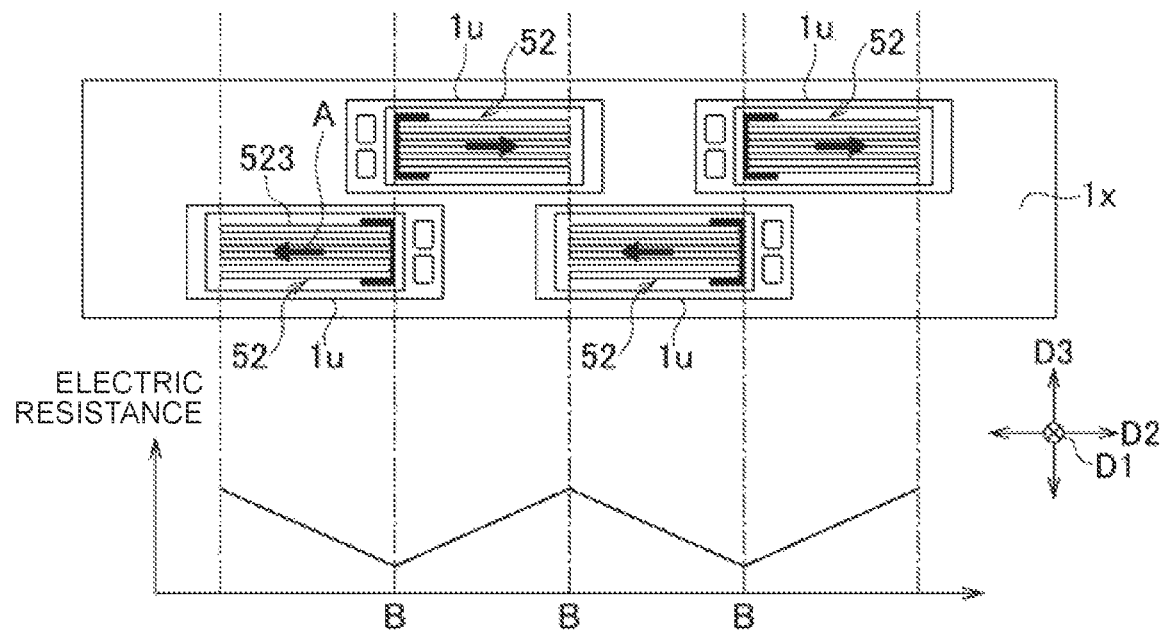
FIGS. 11A and 11B are each a schematic view indicating a distribution of electrical resistance.
Figure 11B:
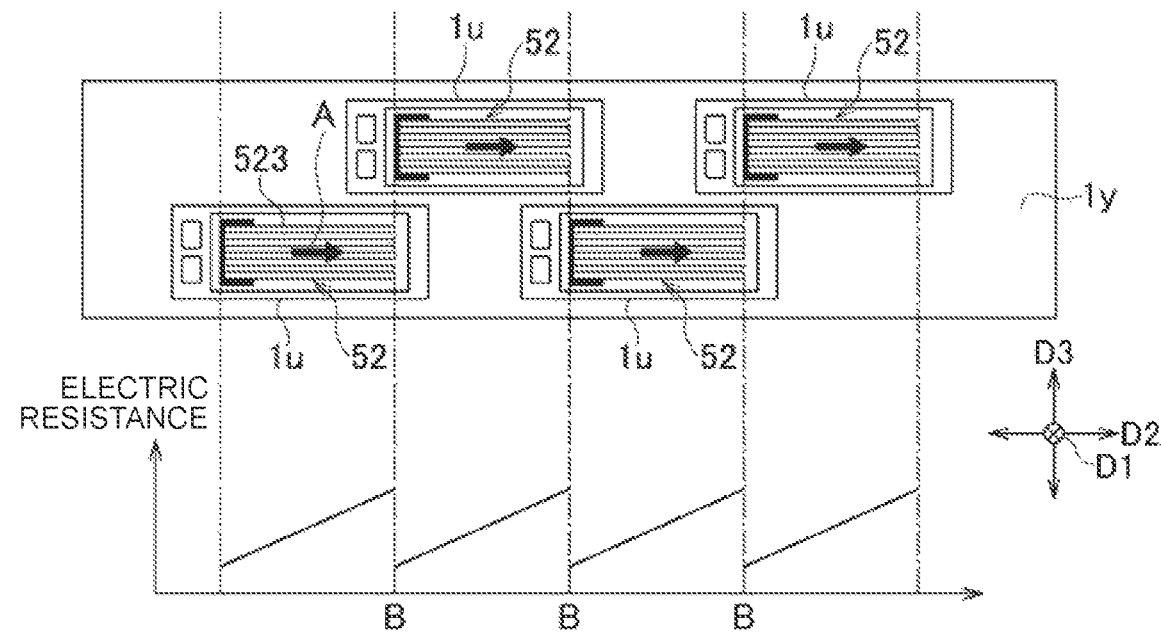

As described above, according to the present embodiment, in the two high potential electrodes 52 which are adjacent to each other in the second direction D2, the extending direction A of one of the two high potential electrodes 52 and the extending direction A of the other of the two high potential electrodes 52 are opposite to each other (see FIG. 10). In a head unit 1*y* of a first reference example depicted in FIG. 11B, the extending directions A are the identical to each other in the two high potential electrodes 52 which are adjacent to each other in the second direction D2. In such a case, both of a part in which the electric resistance is great (a part corresponding to a downstream end or front end 523*b* of the extending part 523) and a part in which the electric resistance is small (a part corresponding to an upstream end or base end 523*a* of the extending part 523) present in one boundary part B of the two high potential electrodes 52 adjacent to each other in the second direction D2. Thus, a difference in volume of the ink droplets in the boundary part B will result in appearance of any unevenness in the density. In contrast, in the present embodiment, as depicted in FIG. 11A, only one of the part in which the electric resistance is great (the part corresponding to the downstream end or front end 523*b* of the extending part 523) and the part in which the electric resistance is small (the part corresponding to the upstream end or base end 523*a* of the extending part 523) present in one boundary part B of the two high potential electrodes 52 adjacent to each other in the second direction D2. Therefore, any part in which the difference in the electric resistance is great does not exist in the boundary part B, thereby making it possible to suppress the occurrence of the unevenness in the density. Note that the wordings of "downstream" and "upstream" of the extending part 523 in this document means "downstream" and "upstream" of electric current runs through the extending part 523.

Further, although not depicted in FIG. 10, the extending direction A of the high potential electrode 52 and the extending direction AA of the low potential electrode 53 are opposite to each other in each of the unit heads 1*u*; and the extending directions AA of two low potential electrodes 53 which are adjacent to each other in the second direction D2 are also opposite to each other. Owing to such a configuration of the low potential electrodes 53 related to the extending directions AA, it is possible to obtain an effect which is similar to that obtained by the configuration of the high potential electrodes 52 related to the extending directions A as described above.

In each of the four unit heads 1*u*, the extending direction A is parallel to the second direction D2, and the four unit heads 1*u* are arranged (aligned) in a stagger (zigzag) manner in the second direction D2. In this case, as compared with a case that the unit heads 1*u*, having the extending direction A along a fourth direction D4 being oblique with respect to the second direction D2, are aligned in a row in the second direction D2, as in a second embodiment (to be described later on; see FIG. 12), the number of the unit head 1*u* necessary for realizing a certain resolution may be made smaller. Accordingly, it is possible to realize the reduction in cost owing to the reduction in the number of the unit head 1*u*. In this document, the fourth direction D4 is bidirectional.

In the two head units 1*x*, the extending direction A of one of the two high potential electrodes 52 which overlap in the third direction D3 and the extending direction A of the other of the two high potential electrodes 52 which overlap in the third direction D3 are opposite to each other (see FIG. 10). In this case, the electric resistance acts complementary in the two high potential electrodes 52 which overlap in the third direction D3, thereby making it possible to effectively suppress the occurrence of any unevenness in the density in a part, of the image, corresponding to the two high potential electrodes 52 which overlap in the third direction D3.

Each of the unit heads 1*u* has the piezoelectric actuator 22 which has a three-layered configuration and in which the actuator part 90 constructed of the one active part 91 and two active parts 92 is formed with respect to one of the plurality of pressure chambers 10. In the piezoelectric actuator 22 having such a three-layered configuration, in a case that any variation in the pressure accompanying with deformation of the first active part 91 corresponding to a certain pressure chamber 10 is transmitted to another pressure chamber 10 adjacent to the certain pressure chamber 10, the variation in the pressure is canceled by the deformation of the second active parts 92, thereby making it possible to effectively suppress the occurrence of the crosstalk.

In the present embodiment, the extending directions A of the two high potential electrodes 52 adjacent to each other in the second direction D2 are opposite to each other (see, FIG. 10), and the extending directions AA of the two low potential electrodes 53 adjacent to each other in the second direction D2 are opposite to each other. In this case, it is possible to suppress both of the unevenness in density due to the difference in magnitude of the electric resistance among the high potential electrodes 52, and the unevenness in density due to the difference in magnitude of the electric resistance among the low potential electrodes 53.

The high potential electrode 52 includes the two high potential receiving parts 522, the trunk part 521 connected to the two high potential receiving parts 522, the plurality of extending parts 523 branched from the trunk part 521; the low potential electrode 53 includes the two low potential receiving parts 532, the trunk part 531 connected to the two low potential receiving parts 532, the plurality of extending parts 533 branched from the trunk part 531. Such a configuration of the high potential electrode 52 and the low potential electrode 53 is particularly suitable in a case that the pressure chambers 10 are arranged highly densely at the downstream side in the extending direction of each of the trunk parts 521 and 531.

Second Embodiment

Figure 12:
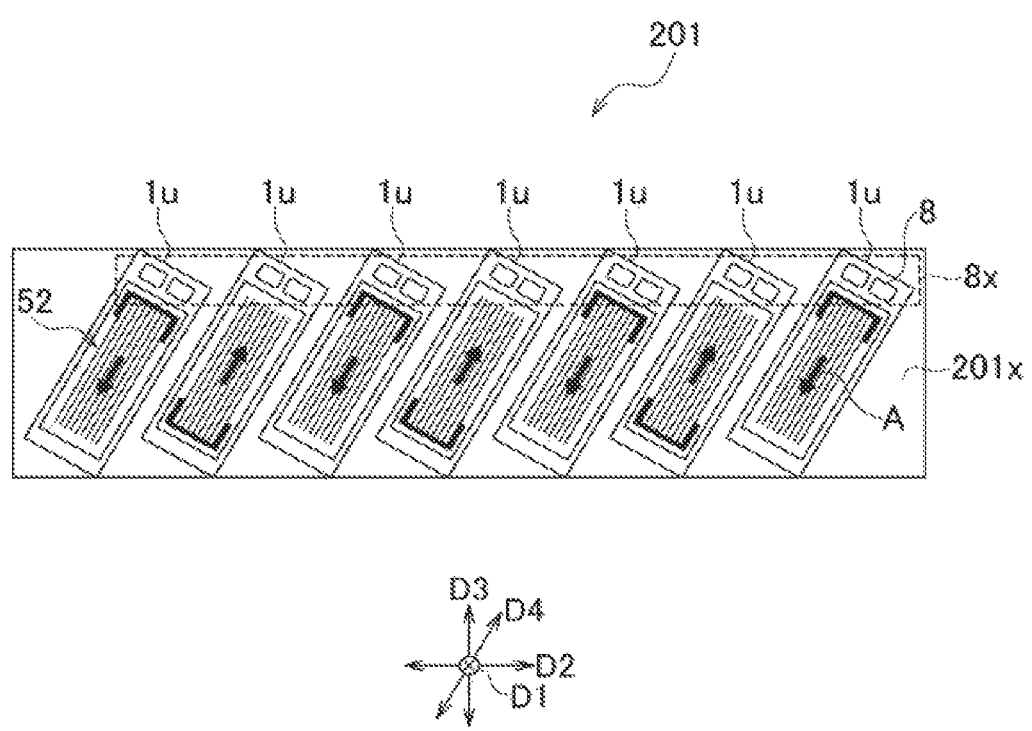
FIG. 12 is a plane view of a head (liquid discharging head) 201.

Next, a head 201 according to a second embodiment of the present disclosure will be explained, with reference to FIGS. 12 and 13.

The head 1 according to the first embodiment (see FIG. 10) has the two head units 1x; the four unit heads 1u constructing each of the two head units 1x each have the extending direction A thereof parallel to the second direction D2, and are arranged in the staggered manner in the second direction D2. In contrast, the head 201 according to the second embodiment (see FIG. 12) has one head unit 201x; seven unit heads 1u constructing the one head unit 201x each have the extending direction A which is along fourth direction D4 (oblique direction with respect to the second direction D2; more specifically, direction which is orthogonal to the first direction D1 and which is inclined with respect to the second direction D2 and the third direction D3), and the seven unit heads 1u are arranged in a row in the second direction D2. In this case, it is possible to increase the resolution, as compared with the case that the unit heads 1u of which extending direction A is parallel to the second direction D2 are arranged in a row in the second direction D2.

Further, in the second embodiment (see FIG. 12), the arrangements of the ink supply ports 8 (openings) in the extending direction A with respect to the high potential electrode 52 are opposite to each other in two unit heads 1u which are adjacent to each other in the second direction D2. Specifically, in a certain unit head 1u, the two ink supply ports 8 are arranged at the upstream side of the extending direction A with respect to the high potential electrode 52, whereas in another unit head 1u which is adjacent to the certain unit head 1u in the second direction D2, the two ink supply ports 8 are arranged at the downstream side of the extending direction A with respect to the high potential electrode 52. Further, the ink supply ports 8 of the seven unit heads 1u are arranged (aligned) side by side in the second direction D2. In this case, it is possible to suppress the size in the third direction D3 of a tube unit 8x (a member configured to support tubes each of which is attached to one of the ink supply ports 8) provided commonly for the ink supply ports 8 of the seven unit heads 1u, as compared with a configuration wherein in the two unit heads 1u which are adjacent in the second direction D2, the arrangements of the ink supply ports 8 (openings) in the extending direction A with respect to the high potential electrode 52 are mutually same and the ink supply ports 8 of the seven unit heads 1u are separated in the third direction D3.

Figure 13A:
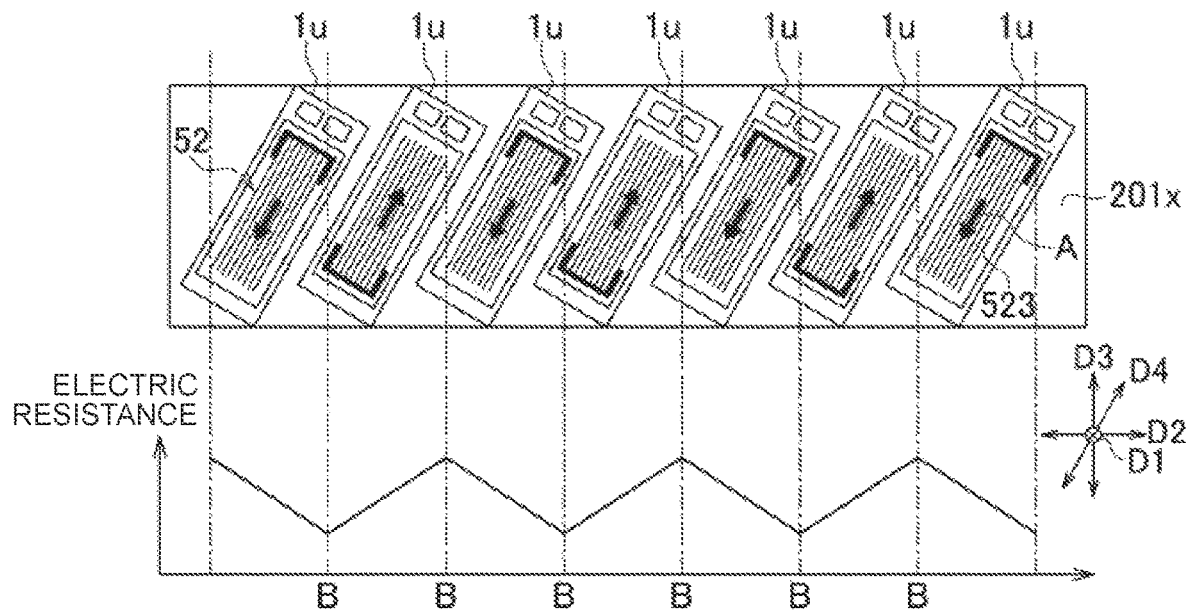
FIGS. 13A and 13B are each a schematic view indicating a distribution of electrical resistance.
Figure 13B:
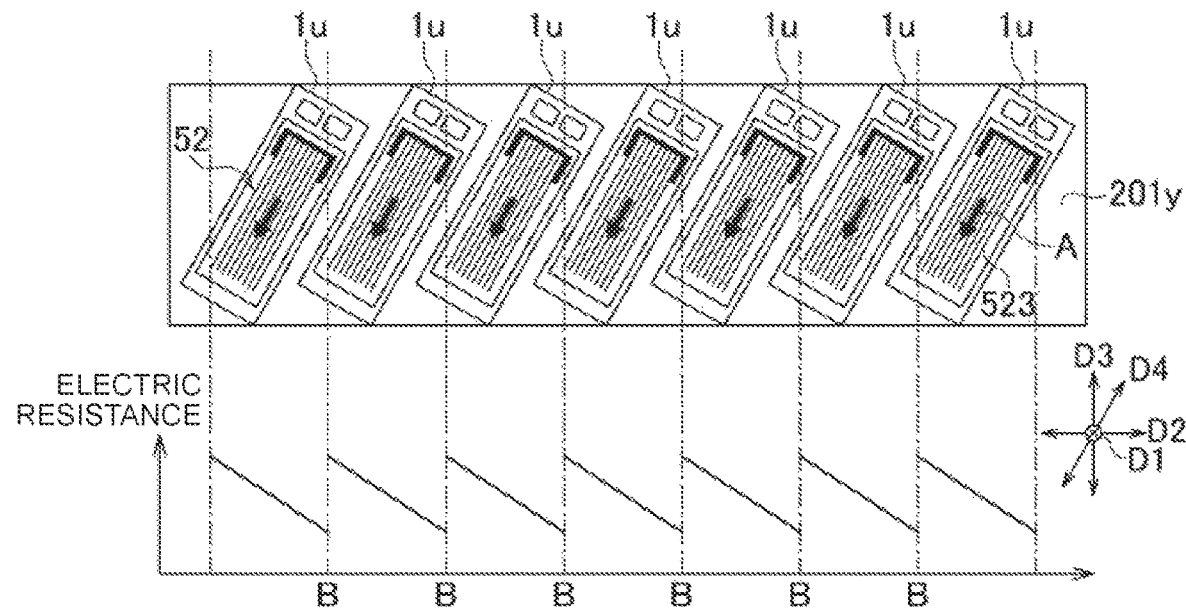

Furthermore, as depicted in FIGS. 13A and 13B, it is possible to obtain an effect which is similar to that obtained by the first embodiment as explained with reference to FIG. 11. In a heat unit 201y of a second reference example as depicted in FIG. 13B, regarding the two high potential electrodes 52 which are adjacent to each other in the second direction D2, the extending direction A of one of two high potential electrodes 52 and the extending direction A of the other of the two high potential electrodes 52 are mutually same. In such a case, both of a part in which the electric resistance is great (a part corresponding to a downstream end or front end 523b of the extending part 523) and a part in which the electric resistance is small (a part corresponding to an upstream end or base end 523a of the extending part 523) present in one boundary part B of the two high potential electrodes 52 adjacent to each other in the second direction D2, and thus a difference in volume of the ink droplets in the boundary part B results in appearance of any unevenness in the density. In contrast, in the second embodiment, as depicted in FIG. 13A, only one of the part in which the electric resistance is great (the part corresponding to the downstream end or front end 523b of the extending part 523) and the part in which the electric resistance is small (the part corresponding to the upstream end or base end 523a of the extending part 523) present in one boundary part B of the two high potential electrodes 52 adjacent to each other in the second direction D2. Therefore, any part in which the difference in the electric resistance is great does not exist in the boundary part B, thereby making it possible to suppress the occurrence of the unevenness in the density.

<Modification>

In the foregoing, the embodiments of the present disclosure have been explained. The present disclosure, however, is not limited to or restricted by the above-described embodiments; it is allowable to make a various kind of design changes to the present disclosure, within the scope described in the claims.

The present disclosure is not limited to or restricted by the first potential being the high potential and the second potential being the low potential; it is allowable that the high and low potentials are reversed to those as described above (namely, the first potential may be the low potential, and the second potential may be the high potential). In such a case, the high potential electrode 52 may be positioned in a lowermost layer, and that the low potential electrode 53 may be positioned in an intermediate layer.

In the above-described embodiment, the extending directions A of the two high potential electrodes 52 adjacent to each other in the second direction D2 are opposite to each other (see, FIG. 10), and the extending directions AA of the two low potential electrodes 53 adjacent to each other in the second direction D2 are opposite to each other. The present disclosure, however, is not limited to this; it is allowable that only one of the extending directions A (see FIG. 10) of the high potential electrodes 52 adjacent to each other in the second direction D2 and extending directions AA of the low potential electrodes 53 adjacent to each other in the second direction D2 may be opposite to each other.

Although the number of the piezoelectric layer constructing the piezoelectric actuator is 3 (three) in the above-described embodiment, the present disclosure is not limited to this. For example, in the above-described embodiment (see FIG. 4), it is allowable that another piezoelectric layer is arranged between the piezoelectric layer 43 of the piezoelectric actuator 22 and the plate 31 of the channel member 21. Further, the piezoelectric actuator is not limited to the piezoelectric actuator 22 having the three-layered configuration wherein the actuator part 90 constructed of one active part 91 and two active parts 92 is formed with respect to each of the plurality of pressure chambers 10, as depicted in FIGS. 5 and 6. It is allowable that the piezoelectric actuator is a piezoelectric actuator having a two-layered configuration wherein one active part is formed with respect to each of the plurality of pressure chambers.

Although in the first embodiment (see FIG. 10), the extending direction A of each of the unit heads 1u is parallel to the second direction D2, the present disclosure is not limited to this. For example, the extending direction A of each of the unit heads 1u may be parallel to the third direction D3.

In the first embodiment (see FIG. 10), the arrangements of the ink supply ports 8 in the extending direction A with respect to the high potential electrode 52 are mutually same in all of the unit heads 1u (specifically, in all of the unit heads 1u, the ink supply ports 8 are arranged on the upstream side in the extending direction A with respect to the high potential electrode 52). The present disclosure, however, is not limited to this; it is allowable that in two units heads 1u, among the four unit heads 1u, in which the high potential electrodes 52 thereof are arranged to be adjacent to each other in the second direction D2, the arrangements of the ink supply ports 8 in the extending direction A with respect to the high potential electrode 52 may be opposite to each other (for example, in each of the head units 1x, the ink supply ports 8 of two unit heads 1u which are arranged on the downstream side in the conveying direction may be arranged on the downstream side in the extending direction A with respect to the high potential electrode 52).

The application of the present disclosure is not limited to the printer, and the present disclosure is applicable also to a facsimile machine, a copying machine, a multifunctional peripheral, etc. Further, the present disclosure is also applicable to liquid discharge apparatuses usable in a usage or application other than recording of an image. For example, it is possible to apply the present disclosure to a liquid discharge apparatus configured to form a conductive pattern on a substrate by discharging a conductive liquid onto the substrate.

What is claimed is:
1. A liquid discharging head having a plurality of unit heads,
   each of the plurality of unit heads comprising:
      a first piezoelectric layer,
      a plurality of driving electrodes arranged on a surface of the first piezoelectric layer and to each of which either one of a first potential and a second potential different from the first potential is to be selectively applied, and
      a common electrode arranged on an opposite side to the plurality of driving electrodes with respect to the first piezoelectric layer, in the first direction being a thickness direction of the first piezoelectric layer; wherein
   the common electrode includes:
      a potential receiving part configured to receive either one of the first potential and the second potential; and
      an extending part extending, from a connection part between the potential receiving part and the extending part to an end of the extending part, in an extending direction orthogonal to the first direction, so as to overlap with the plurality of driving electrodes in the first direction, the extending direction being a direction from the connection part toward the end of the extending part;
   the plurality of unit heads is arranged so that the common electrodes of the plurality of unit heads are adjacent to each other in a second direction orthogonal to the first direction; and
   the extending directions of two of the common electrodes adjacent to each other in the second direction are opposite to each other such that the connection part is positioned on one side in the second direction of the end of the extending part in first one of the two of the common electrodes, and the end of the extending part is positioned on the one side in the second direction of the connection part in second one of the two of the common electrodes.

2. The liquid discharging head according to claim 1, wherein in each of the plurality of unit heads, the extending direction of the common electrode is parallel to the second direction, and the plurality of unit heads are arranged in a staggered manner in the second direction.

3. The liquid discharging head according to claim 2, wherein two head units, each of which is constructed of some of the plurality of unit heads, are arranged side by side in a third direction orthogonal to the first direction and the second direction; and
   in the two head units, the extending directions of two of the common electrodes overlap with each other in the third direction are opposite to each other.

4. The liquid discharging head according to claim 1, wherein the plurality of unit heads is aligned in a row in the second direction, the extending direction of the common electrode of each of the plurality of unit heads being along a fourth direction oblique with respect to the second direction.

5. The liquid discharging head according to claim 4, wherein each of the plurality of unit heads has a channel member in which a channel including a plurality of nozzles is formed and in a surface of which an opening communicating with the channel is formed;
   in two unit heads, of the plurality of unit heads, adjacent to each other in the second direction, positions of the openings with respect to the common electrodes in the extending direction are opposite to each other; and
   the openings of the plurality of unit heads are arranged side by side in the second direction.

6. The liquid discharging head according to claim 1, wherein each of the plurality of unit heads includes:
   the first piezoelectric layer;

a second piezoelectric layer stacked with respect to the first piezoelectric layer in the first direction;

a third piezoelectric layer stacked with respect to the first piezoelectric layer and the second piezoelectric layer in the first direction such that the second piezoelectric layer is interposed between the first piezoelectric layer and the third piezoelectric layer;

a first electrode layer arranged on a surface, of the first piezoelectric layer, on an opposite side to the second piezoelectric layer in the first direction;

a second electrode layer arranged between the first piezoelectric layer and the second piezoelectric layer in the first direction; and a third electrode layer arranged between the second piezoelectric layer and the third piezoelectric layer in the first direction;

the first electrode layer includes the plurality of driving electrodes;

the second electrode layer includes a first potential electrode maintained at the first potential;

the third electrode layer includes a second potential electrode maintained at the second potential; and at least one of the first potential electrode and the second potential electrode is the common electrode.

7. The liquid discharging head according to claim 6, wherein both of the first potential electrode and the second potential electrode are the common electrode;

the extending directions of the first potential electrodes adjacent to each other in the second direction are opposite to each other, and the extending directions of the second potential electrodes adjacent to each other in the second direction are opposite to each other.

8. The liquid discharging head according to claim 6, wherein one first active part is provided at a portion, of the first piezoelectric layer, interposed between one of the plurality of driving electrodes and the first potential electrode in the first direction, two second active parts are provided at portions, of each of the first piezoelectric layer and the second piezoelectric layer, interposed between the one of the plurality of driving electrodes and the second potential electrode in the first direction, the one first active part being interposed between the two second active parts in a direction orthogonal to the first direction.

9. The liquid discharging head according to claim 1, wherein the connection part between the potential receiving part and the extending part is a trunk part connected to the potential receiving part, and the extending part is a plurality of linear parts each branched from the trunk part.

10. The liquid discharging head according to claim 9, wherein the trunk part is a linear part extending from the potential receiving part in a direction orthogonal to the first direction and the extending direction, and the plurality of linear parts of the extending part extends parallel to each other.

11. A printing apparatus comprising:

the liquid discharging head as defined in claim 1, and a conveyer configured to convey a printing medium to which a liquid is to be discharged from the liquid discharging head.

* * * * *